United States Patent
Thei et al.

(10) Patent No.: US 10,014,291 B2
(45) Date of Patent: Jul. 3, 2018

(54) SIC CRYSTALLINE ON SI SUBSTRATES TO ALLOW INTEGRATION OF GAN AND SI ELECTRONICS

(71) Applicants: Kong-Beng Thei, Pao-Shan Village (TW); Jiun-Lei Jerry Yu, Zhudong Township (TW); Chun Lin Tsai, Hsinchu (TW); Hsiao-Chin Tuan, Jhudong County (TW); Alex Kalnitsky, San Francisco, CA (US)

(72) Inventors: Kong-Beng Thei, Pao-Shan Village (TW); Jiun-Lei Jerry Yu, Zhudong Township (TW); Chun Lin Tsai, Hsinchu (TW); Hsiao-Chin Tuan, Jhudong County (TW); Alex Kalnitsky, San Francisco, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 118 days.

(21) Appl. No.: 13/760,496

(22) Filed: Feb. 6, 2013

(65) Prior Publication Data
US 2013/0146893 A1     Jun. 13, 2013

Related U.S. Application Data

(62) Division of application No. 12/881,505, filed on Sep. 14, 2010, now Pat. No. 8,389,348.

(51) Int. Cl.
H01L 29/15     (2006.01)
H01L 27/06     (2006.01)
(Continued)

(52) U.S. Cl.
CPC ...... *H01L 27/0617* (2013.01); *H01L 21/8258* (2013.01); *H01L 27/085* (2013.01); *H01L 21/26506* (2013.01); *H01L 2924/0002* (2013.01)

(58) Field of Classification Search
CPC . H01L 21/8258; H01L 27/0617; H01L 29/26; H01L 29/267
(Continued)

(56) References Cited

U.S. PATENT DOCUMENTS 4,826,784 A * 5/1989 Salerno ............. H01L 21/02639
117/95
5,081,062 A * 1/1992 Vasudev ............. H01L 21/8258
257/347
(Continued)

FOREIGN PATENT DOCUMENTS

CN      1892984      1/2007
CN     101562180    10/2009
(Continued)

OTHER PUBLICATIONS

Yang et al., "Approach to obtain high quality GaN on Si and SiC-on-silicon-on-insulator compliant substrate by molecular-beam epitaxy", Journal of Vacuum Science and Technology B 13 (1995) pp. 789-791.*
(Continued)

*Primary Examiner* — Jay C Kim
(74) *Attorney, Agent, or Firm* — Hauptman Ham, LLP

(57) ABSTRACT

A silicon substrate with a GaN-based device and a Si-based device on the silicon substrate is provided. The silicon substrate includes the GaN-based device on a SiC crystalline region. The SiC crystalline region is formed in the silicon substrate. The silicon substrate also includes the Si-based
(Continued)

device on a silicon region, and the silicon region is next to the SiC crystalline region on the silicon substrate.

20 Claims, 5 Drawing Sheets

(51) Int. Cl.
*H01L 21/8258* (2006.01)
*H01L 27/085* (2006.01)
*H01L 21/265* (2006.01)

(58) Field of Classification Search
USPC .......................................................... 257/77
See application file for complete search history.

(56) References Cited

U.S. PATENT DOCUMENTS

| | | | | |
|---|---|---|---|---|
| 5,286,985 A * | 2/1994 | Taddiken | .......... | H01L 27/11898 257/192 |
| 5,373,171 A * | 12/1994 | Imai | .................. | H01L 21/02376 148/33.4 |
| 5,510,275 A * | 4/1996 | Malhi | .................. | H01L 29/1033 257/192 |
| 5,726,440 A * | 3/1998 | Kalkhoran | ............ | H01L 31/103 250/214.1 |
| 5,734,180 A * | 3/1998 | Malhi | .................. | H01L 27/088 257/339 |
| 5,877,515 A * | 3/1999 | Ajit | ..................... | H01L 29/1608 257/154 |
| 5,939,754 A * | 8/1999 | Hoshi | ................. | H01L 29/1608 257/192 |
| 6,110,813 A * | 8/2000 | Ota | ..................... | H01L 21/0485 257/E21.062 |
| 6,171,936 B1 * | 1/2001 | Fitzgerald | ......... | H01L 21/02381 438/503 |
| 6,388,271 B1 * | 5/2002 | Mitlehner | ........... | H01L 21/8213 257/343 |
| 6,605,151 B1 * | 8/2003 | Wessels | ................... | C30B 23/02 117/103 |
| 6,846,710 B2 * | 1/2005 | Yi | ....................... | H01L 21/8249 257/E21.696 |
| 7,019,332 B2 * | 3/2006 | Vieira | ................... | H01S 5/0687 257/184 |
| 7,033,438 B2 * | 4/2006 | Bensahel | ................ | C30B 25/02 117/101 |
| 7,125,785 B2 * | 10/2006 | Cohen | ..................... | H01L 21/84 257/E21.131 |
| 7,141,498 B2 * | 11/2006 | Malhan | ............... | H01L 21/0485 257/E21.062 |
| 7,166,866 B2 * | 1/2007 | Zeng | .................. | H01L 29/0615 257/198 |
| 7,217,950 B2 * | 5/2007 | Kaneko | ................ | H01L 29/165 257/192 |
| 7,420,226 B2 * | 9/2008 | Augustine et al. | .......... | 257/195 |
| 7,436,004 B2 * | 10/2008 | Shimoida | ............ | H01L 29/0834 257/107 |
| 7,626,246 B2 * | 12/2009 | Lochtefeld | ........ | H01L 21/82380 257/510 |
| 7,750,371 B2 * | 7/2010 | Gluschenkov | ...... | H01L 29/0821 257/197 |
| 7,781,786 B2 * | 8/2010 | Hayashi | .............. | H01L 29/6606 257/183 |
| 7,834,456 B2 * | 11/2010 | Tabatabaie et al. | .......... | 257/745 |
| 7,847,298 B2 * | 12/2010 | Ogihara | ............... | G03G 15/326 257/79 |
| 7,863,877 B2 * | 1/2011 | Briere | ................. | H01L 27/0211 323/222 |
| 7,897,492 B2 * | 3/2011 | Quick | ............... | H01L 21/02381 438/483 |
| 8,212,294 B2 * | 7/2012 | Hoke | ................ | H01L 21/76251 257/255 |
| 8,253,211 B2 * | 8/2012 | Cheng | ............... | H01L 21/02532 257/431 |
| 8,415,671 B2 * | 4/2013 | Zhang | ................. | H01L 29/0623 257/66 |
| 8,487,316 B2 * | 7/2013 | Cheng | ............... | H01L 21/8252 257/70 |
| 8,530,938 B2 * | 9/2013 | Briere | ................. | H01L 21/8252 257/200 |
| 8,664,664 B2 * | 3/2014 | Harris | ................. | H01L 21/0475 257/77 |
| 8,722,482 B2 * | 5/2014 | Wahl | ................. | H01L 21/26506 438/199 |
| 8,866,190 B2 * | 10/2014 | Briere | ................. | H01L 21/0237 257/192 |
| 9,147,701 B2 * | 9/2015 | Saunders | ............... | H01L 27/142 |
| 2002/0041003 A1 * | 4/2002 | Udrea | .................... | H01L 21/764 257/502 |
| 2004/0012037 A1 * | 1/2004 | Venkatesan | ....... | H01L 21/76251 257/200 |
| 2005/0012143 A1 * | 1/2005 | Tanaka | ................ | H01L 29/4966 257/328 |
| 2007/0054467 A1 * | 3/2007 | Currie | ............... | H01L 21/76254 438/458 |
| 2009/0050939 A1 * | 2/2009 | Briere | ............... | H01L 29/66462 257/201 |
| 2009/0189191 A1 | 7/2009 | Sato et al. | | |
| 2011/0095335 A1 * | 4/2011 | Ishida | ................. | H01L 29/0611 257/190 |

FOREIGN PATENT DOCUMENTS

| | | | |
|---|---|---|---|
| TW | 200721452 | | 6/2007 |
| TW | 200945625 | | 11/2009 |
| WO | WO 2010/001607 | * | 1/2010 ........... H01L 21/338 |

OTHER PUBLICATIONS

Mogab et al., "Conversion of Si to epitaxial SiC by reaction with C2H2", Journal of Applied Physics 45 (1974) pp. 1075-1084.*
Davis et al., "Conventional and pendeo-epitaxial growth of GaN(0001) thin films on Si(111) substrates", Journal of Crystal Growth 231 (2001) pp. 335-341.*
Lindner, "High-dose carbon implantations into silicon: fundamental studies for new technological tricks", Applied Physics A 77 (2003) pp. 27-38.*
Cervantes-Contreras et al., "Molecular beam epitaxial growth of GaN on (100)- and (111) Si substrates coated with a thin SiC layer", Journal of Crystal Growth 227-228 (2001) pp. 425-430.*
Reference_Contact_Region.pdf, alternate view drawing of Fig. 1C of Wahl et al. (U.S. Pat. No. 8,722,482) (2018).*
Office Action dated Mar. 14, 2013 from corresponding application No. CN 201010610681.5.
Ristic et al., "Growth of GaN Layers on SiC/Si(111) Substrate by Molecular Beam Epitaxy", Materials Science and Engineering B93 (2002) pp. 172-176.
Office Action dated Nov. 21, 2014 from corresponding No. TW100106854.
Office Action dated Dec. 26, 2017 from corresponding No. TW105135674.

* cited by examiner

SIC CRYSTALLINE ON SI SUBSTRATES TO ALLOW INTEGRATION OF GAN AND SI ELECTRONICS

CROSS-REFERENCE TO RELATED APPLICATION

The present application is a divisional of U.S. application Ser. No. 12/881,505, filed Sep. 14, 2010, which is incorporated by reference herein in its entirety.

FIELD

This application relates to a SiC crystalline in a Si substrate and, more particularly, to a SiC crystalline in a Si substrate to allow integration of III-V-based devices with Si-based devices.

BACKGROUND

Gallium nitride (GaN)-based materials have several advantages on electrical, mechanical and chemical properties, such as wide band gap, high breakdown voltage, high electron mobility, large elastic modulus, high piezoelectric and piezoresistive coefficients, etc., as well as chemical inertness. Such advantages make GaN-based materials attractive for making devices such as high brightness light-emitting diodes (LEDs), power switching devices, regulators, battery protectors, panel display drivers, telecommunication devices, etc.

In addition, progress made in designs and manufacturing of Si-based devices and electronics in the past several decades has demonstrated the unsurpassed levels of scaling capability and circuit complexity of Si-base devices. As a result, it's desirable to integrate GaN-based devices with Si-based devices on the same chip to allow enhanced functionalities and design flexibility for advanced applications. Devices made with GaN-based materials are often formed on sapphire substrates or SiC substrates. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
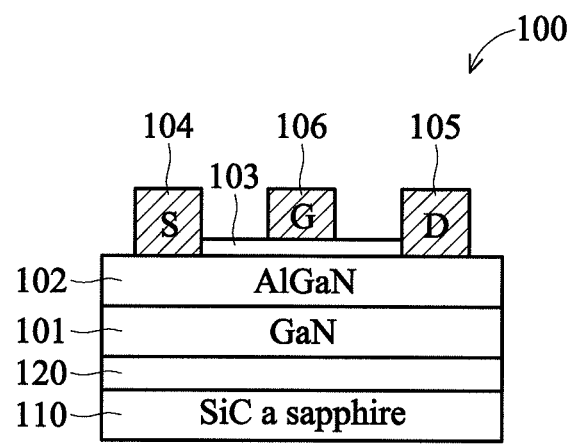
FIG. 1A shows a cross section of a GaN-based metal-oxide-semiconductor high-electron-mobility-transistor (MOS-HEMT), in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1B:
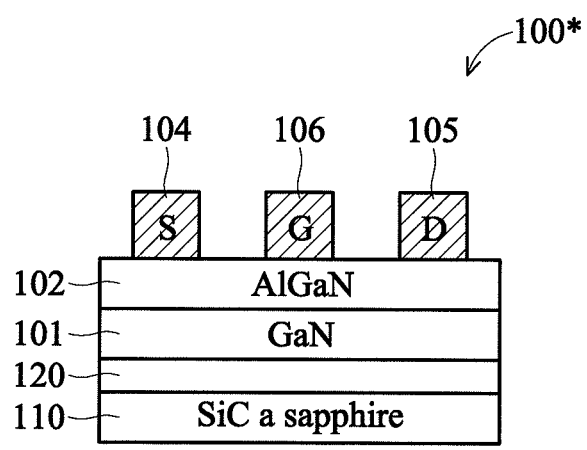
FIG. 1B shows a cross section of a GaN-based HEMT, in accordance with some embodiments.

FIG. 1A shows a cross section of a GaN-based metal-oxide-semiconductor high-electron-mobility-transistor (MOS-HEMT) 100, in accordance with some embodiments. As shown in FIG. 1, transistor 100 includes a GaN layer 101, an AlGaN layer 102, an $Al_2O_3$ gate dielectric layer 103, source contact 104, drain contact 105, and a gate 106. In some other embodiments, the gate 106 is directly deposited over the AlGaN layer 102 and the $Al_2O_3$ gate dielectric layer 103 does not exist. Without the $Al_2O_3$ gate dielectric layer, the transfer is a GaN HEMT, as shown in FIG. 1B in accordance with some embodiments.

Gate 106 is made of one or more conductive materials, such as metals or doped polysilicon. An example of materials used to form gate 106 is Ni/Au. Source and drain contacts 104, 105 are also made of conductive material(s), such as metals. An example of materials used for form source and drain contacts 104, 105 are Ti/Al. The GaN layer 101 is grown on a SiC substrate or a sapphire substrate 110. In some embodiments, there is a buffer layer 120 between the GaN layer 101 and substrate 110. The buffer layer 120 does not exist in some devices. The buffer layer 120 is used to enhance the growth and the quality of GaN. The buffer layer 120 may also be called a nucleation layer. An example of material(s) used for buffer layer 120 is a combination of GaN and AlGaN. Another example of material for buffer layer 120 is AlN.

Both SiC substrates and sapphire substrates, both are crystalline solid, are expensive to make. Further, the sizes of pure SiC and sapphire substrates are relatively small. For example, they can be in 2, 3, 4, or 6 inches. In contrast, Si substrate can be 12 inches or larger. In addition, pure SiC or sapphire substrates are not compatible with complementary metal-oxide-semiconductor (CMOS) processing for Si-based devices.

Comparing SiC substrates with sapphire substrates, SiC substrates have better thermal properties and electric conductivity than sapphire substrates. In addition, it can withstand higher temperature than sapphire substrates. Therefore, GaN-based devices built on SiC substrate are more desirable. However, the problems, such as high cost, small substrate size, and incompatible with CMOS processing, described above that are related to SiC substrates still need to be resolved.

Figure 2A:
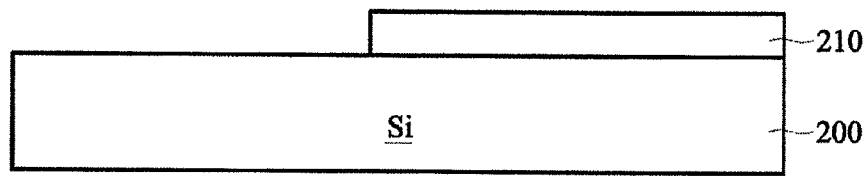
FIGS. 2A-2C show cross-sectional diagrams of a silicon (Si) substrate undergoing a process sequence of forming SiC crystalline on the Si substrate, in accordance with some embodiments.
Figure 2B:
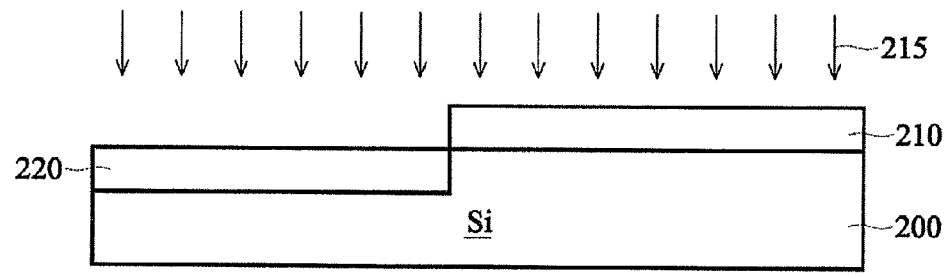
Figure 2C:
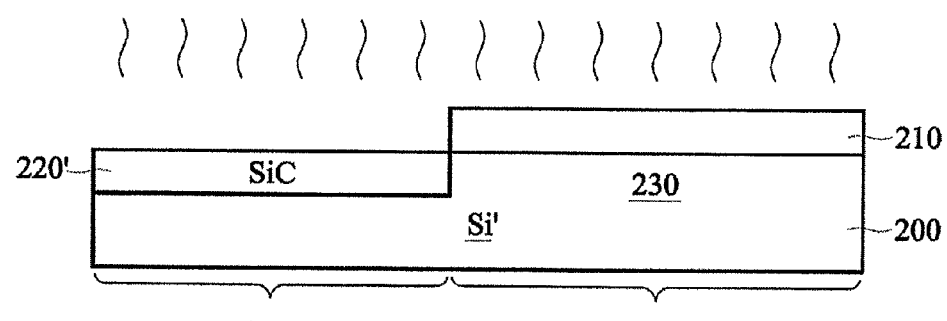

If SiC crystalline below the GaN-based devices can be formed on Si substrate, the integration of these two types of devices would be a lot easier. In addition, the problem of small sizes of SiC substrates (with SiC only) would go away, since Si substrates are relatively large, such as 8", 12" and 18" for the near future. FIGS. 2A-2C show cross-sectional diagrams of a silicon (Si) substrate 200 undergoing a process sequence of forming SiC crystalline on the Si substrate, in accordance with some embodiments. FIG. 2A shows an implant-stop layer 210 is formed on Si substrate 200 and the implant-stop layer 210 covers a portion of the substrate. The implant-stop layer 210 can be made of one or more dielectric materials and can be a single layer or a composite layer. In some embodiments, the implant layer is made of silicon dioxide ($SiO_2$). The thickness required for the implant-stop layer 210 depends on the implant energy for SiC formation.

In some embodiments, the thickness of the implant-stop layer 210 is in a range from about 100 Å to about 5000 Å. In some other embodiments, the implant-stop layer 210 is a composite layer, made of more than one dielectric layers. For example, the implant-stop layer 210 include a oxide layer with a thickness in a range from about 50 Å to about 1000 Å and a nitride layer with a thickness in a range from about 300 Å to about 5000 Å. In yet some embodiments, the implant-stop layer 210 is made of photoresist. The implant-stop layer 210 is deposited by chemical vapor deposition (CVD), such as plasma enhanced CVD, in accordance with some embodiments. The implant-stop layer 210 is patterned to cover a portion of the Si substrate and to expose the remaining portion for carbon (C) implantation.

FIG. 2B shows that carbon ions 215 are directed toward the surface of substrate 200, in accordance with some embodiments. Some carbon ions are implanted into the portion of Si substrate not covered by the implant-stop layer 210. The carbon is implanted into implant region 220 of the Si-substrate. In some embodiments, the thickness of the implanted region 220 is in a range between about 1 μm to about 8 μm. The carbon atoms are ion implanted into the Si substrate by ion implantation. The implant energy for the carbon ion implantation is in a range between about 20 KeV to about 800 KeV, in accordance with some embodiments. The carbon implant dose is in a range between about 1E16 to about 1E19 ions/cm$^2$, in accordance with some embodiments.

The carbon implantation can occur in multiple steps with different implant energy in each step to form implant region 220. During implantation, the Si substrate can be held at various temperatures. In some embodiments, the temperature of substrate 200 can be held in a range between about room temperature to about 150° C. (cold implantation) during carbon ion implantation. Substrate 200 will undergo an annealing process to transform implanted C in Si substrate into SiC crystal. In some other embodiments, the temperature of substrate 200 can be held in a range between about 500° C. to about 900° C. (hot implantation). Carbon implanted into a Si substrate at a relatively high temperature, such as between about 500° C. to about 900° C., can form SiC crystals in some regions of the implanted substrate during hot ion implantation, which improves the quality of SiC substrate after annealing.

After carbon ion implantation, substrate 200 undergoes annealing to form SiC crystal from the implanted carbon and the neighboring Si network, in accordance with some embodiments. If carbon is implanted by hot ion implantation, the annealing operation might be skipped. However, if carbon is implanted at a low temperature, such as between about room temperature to about 150° C., the annealing operation is required to form SiC crystal. In some embodiments, the annealing temperature is in a range between about 900° C. to about 1200° C. The annealing can occur in a rapid thermal processing equipment, such as an equipment for rapid thermal anneal, flash anneal, and laser anneal, or a furnace. In some embodiments, annealing time is between about 2 minutes to about 45 minutes. In some other embodiments, the annealing time is in a range from about 30 minutes to about 4 hours. If the annealing temperature is higher, the annealing time can be lower. The annealing temperature and duration are affected by the temperature the ion implantation is performed. Hot ion implantation could form some SiC during implantation. As a result, the annealing time and temperature could be reduced. In some embodiments, the annealing is conducted in the presence of an inert gas, such as Ar or He.

Figure 3A:
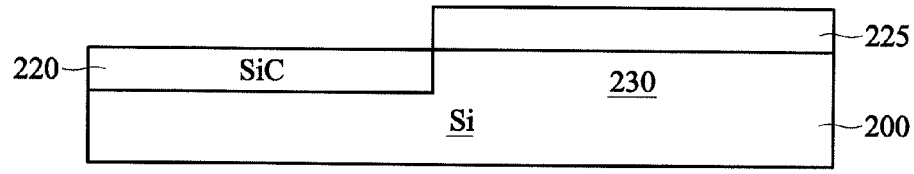
FIGS. 3A-3F show cross-sectional diagrams of a silicon (Si) substrate 200 undergoing a process sequence of forming GaN-based and Si-based devices, in accordance with some embodiments.

After the annealing, the SiC crystal(s) is formed in region 220' next to silicon region 230 under the implant-stop layer 210. Region 220' may be slightly larger than region 220 due to the insertion of carbon atoms. GaN-based materials can be deposited upon SiC in region 220' to form GaN-based devices. The silicon region 230 can be used to deposit materials to form Si-based devices. FIGS. 3A-3E show cross-sectional diagrams of a silicon (Si) substrate 200 undergoing a process sequence of forming GaN-based and Si-based devices, in accordance with some embodiments. FIG. 3A shows a Si substrate 200 with a region 220 of SiC crystalline. Substrate 200 also has a region 230 covered by a dielectric layer 225. In some embodiment, the dielectric layer 230 is made of an oxide with a thickness in a range between about 100 Å to about 5000 Å. Other dielectric materials may also be used. The dielectric layer 225 is used to protect the Si surface in region 230. In some embodiments, the dielectric layer 225 is the implant-stop layer 210 described above.

Figure 3B:
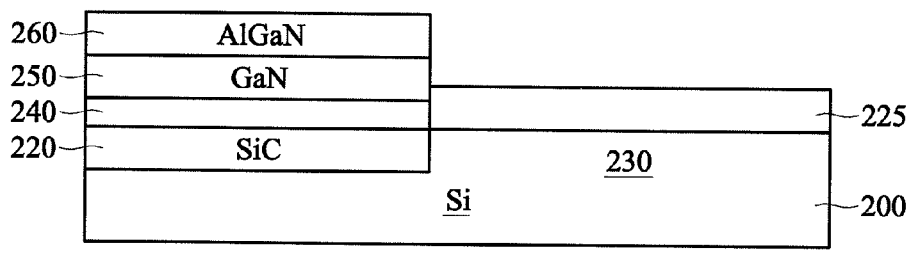

A buffer layer 240 is then deposited on the surface of SiC crystalline region 220, as shown in FIG. 3B in accordance with some embodiment. The buffer layer 240 may be formed of, for example, a group III-N based material, a metal nitride, a metal carbide, a metal carbon-nitride, a pure metal, a metal alloy, silicon-containing material, or the like formed by, for example, metal organic chemical vapor deposition (MOCVD), metal organic vapor phase epitaxy (MOVPE), plasma-enhanced CVD (PECVD), remote plasma enhanced CVD (RP-CVD), molecular beam epitaxy (MBE), hydride vapor phase epitaxy (HVPE), liquid phase epitaxy (LPE), chloride VPE (Cl-VPE), or the like. Examples of materials that may be used for the buffer layer 240 include GaN, InN, AlN, InGaN, AlGaN, AlInN, AlInGaN, and the like. As discussed above, the buffer layer 410 may include a plurality of layers, such as a plurality of AlN layers and a plurality of silicon-doped GaN layers stacked in an alternating pattern. Buffer layer 240 may be doped with a p-type or an n-type impurity, or substantially un-doped. As a result, buffer layer 240 may be of p-type, n-type, or substantially neutral. In some embodiments, the deposition temperature of the buffer layer 240 is in a range from about 200° C. to about 1200° C.

Following the deposition of the buffer layer 240, a GaN layer 250 is deposited over the buffer layer 240. The method used to form the GaN layer 250 may include MOCVD, MOVPE, MBE, HVPE, LPE, VPE, Cl-VPE, or the like. The thickness of the GaN layer is in a range between about 0.8 μm to about 5 in accordance with some embodiments. In some embodiments, the deposition temperature of the GaN layer 250 is in a range from about 200° C. to about 1200° C.

Figure 3C:
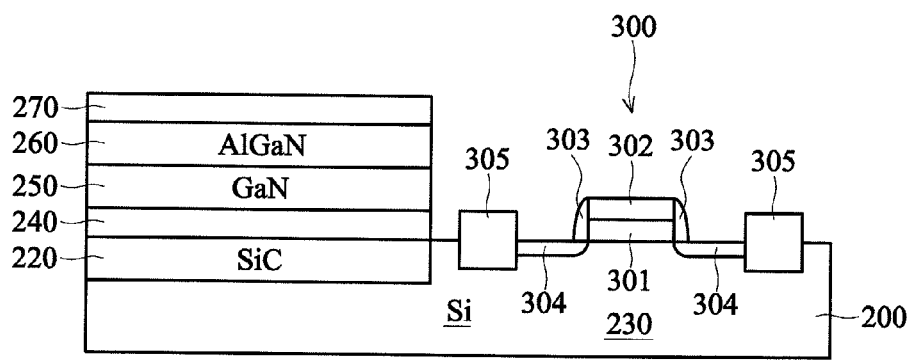

An AlGaN layer 260 is then deposited over the GaN layer 250, as shown in FIG. 3A, in accordance with some embodiments. The AlGaN 260 layer may be formed by MOCVD, MOVPE, MBE, HVPE, LPE, VPE, Cl-VPE, or the like. The thickness of the AlGaN layer is in a range between about 10 nm to about 1000 nm, in accordance with some embodiments. Following the deposition of the AlGaN layer 260, a protective dielectric layer 270 is deposited, as shown in FIG. 3C in accordance with some embodiments. The protective dielectric layer 270 may be made of oxide, nitride, oxynitride, or other suitable dielectric materials. The protective dielectric layer 270 is used to protect the GaN-based materials during the formation of Si-based MOS field effect transistors (FETs). The formation of layers 240, 250, 260, and 270 may involve patterning and etching to remove these layers from being deposited over the dielectric layer 225. In some embodiments, the deposition temperature of the AlGaN layer 260 is in a range from about 200° C. to about 1200° C.

After the formation of the protective dielectric layer 270, the dielectric layer 225 is removed from the substrate to expose Si region 230. In some embodiments, the removal of the dielectric layer 225 involves removing layers, such as layers 240, 250, 260, and 270, deposited over the region 230. Patterning and etching could be involved. Afterwards, a MOSFET 300 is formed on region 230, as shown in FIG. 3C in accordance with some embodiments. The MOSFET 300 includes a gate dielectric layer 301, a gate 302, spacers 303, source and drain regions 304 and isolation structures 305, in accordance with some embodiments. The isolation structures 305 could be field oxide or shallow trench isolation.

Figure 3D:
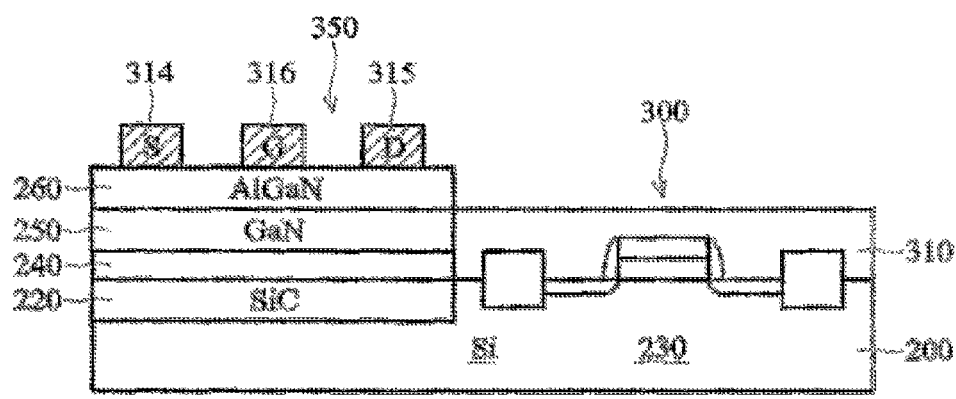
Figure 3E:
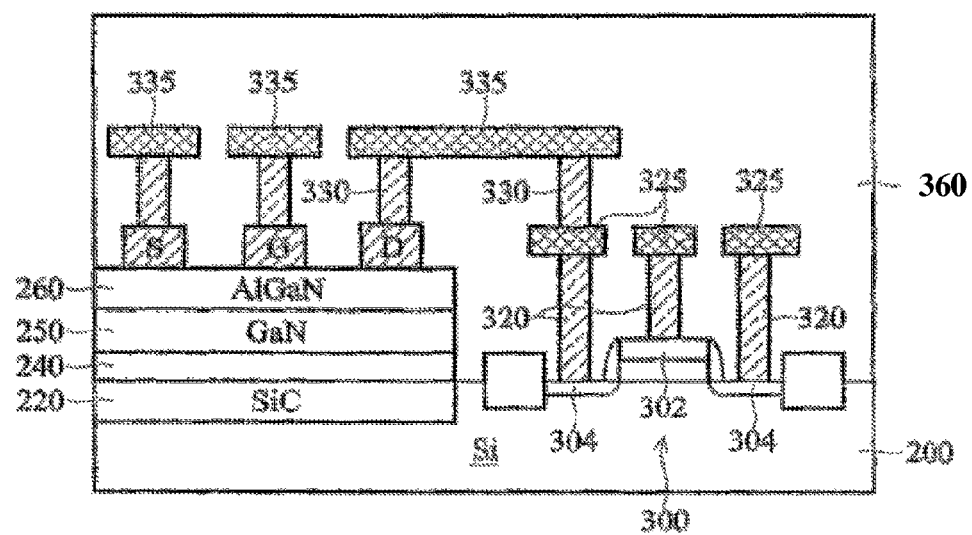
Figure 3F:
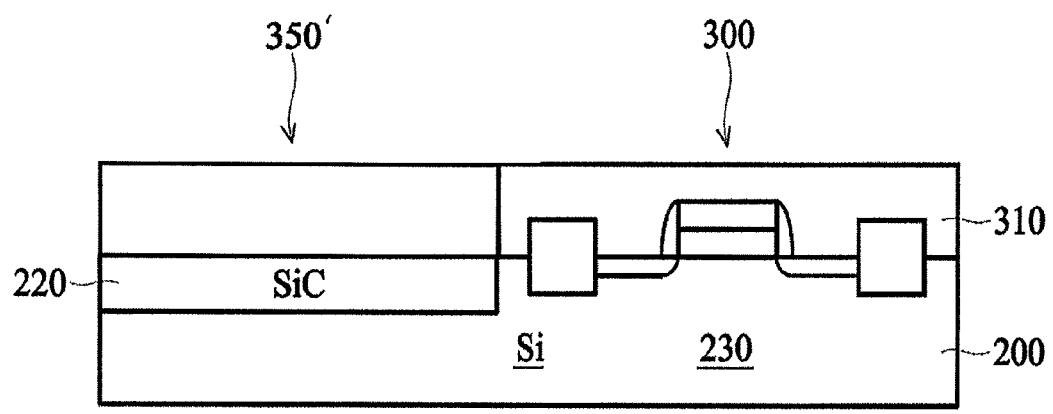

After the MOSFET 300 is formed, the Si-region 230 and the devices, such as MOSFET 300, are covered by a protective dielectric layer 310, as shown in FIG. 3D in accordance with some embodiments. The protective dielectric layer 310 may be made of oxide, nitride, oxynitride, or other suitable material(s). The protective dielectric layer 310 is used to protect the Si surface and devices, such as MOSFET 300. Gate 316, source contact 314, and drain contact 315 are then formed over the AlGaN layer 260. In some embodiments, the gate 316 and source/drain contacts 314, 315 are made of different materials. After the gate 316 and source/drain contacts 314, 315 are formed, GaN HEMT 350 is formed, as shown in FIG. 3D Following the formation of GaN HEMT 350, the formation of interconnects for both MOSFET 300 and HEMT 350 starts. Metal 1 layer 325 and contacts 320 are formed to make contact to the gate 302, and source/drain regions 304, 305, as shown in FIG. 3E in accordance with some embodiments. During the formation of metal 1 layer 325 and contacts 320, the HEMT 350 and exposed GaN-based materials can be covered by a protective dielectric layer. Metal 2 layer 335 and vias 330 are then formed to make connection to metal 1 layer 325 in the Si region and gate 316, source/drain contacts 314, 315 of HEMT 315. Metal 2 layer 335 and vias 330 may be formed by single or dual damascene process. Additional interconnect layers can be formed above metal 2 layer 335 to enable additional interconnect. The interconnect structures are isolated by one or more dielectric layers 360. According to one or more embodiments, a GaN-based device 350' as depicted in FIG. 3F is provided. In some embodiments, the GaN-based device 350' is connected with the device 300 shown in FIG. 3F. The GaN-based device 350' is selected from a group consisting of a light-emitting device, a power switching device, a regulator, a battery protector, a panel display driver, and a telecommunication device, for example. According to one or more embodiments, the GaN-based device 350' is formed on the SiC layer 220 similar to the GaN HEMT 350 shown in FIG. 3D.

As described above, during the formation of devices 300, 350, and 350', Si region 230 and SiC region 220 are alternately covered to protect one region from being affected by the processing operations intended for the other region. The processing sequence is determined based on concerns of thermal compatibility, implant diffusion, and contamination.

The GaN-based device structures 100, 100*, 350, 350' and Si-based device structure 300 are merely examples. Other types GaN-based devices with different layers and other types of Si-based devices may also use the blended SiC/Si regions on a Si substrate to form and integrate a mixture of GaN-based and Si-based devices. The process sequence described in FIGS. 3A-3E is also only an example. Other processing sequences may also be used.

Although the embodiments of mechanism of forming SiC crystalline on Si substrates are described to be used for forming GaN-based devices. The embodiments may also apply for forming devices made of other types of III-V compound materials.

The mechanisms of forming SiC crystalline regions on Si substrate described above enable formation and integration of GaN-based devices and Si-based devices on a same substrate. The SiC crystalline regions are formed by implanting carbon into regions of Si substrate and then annealing the substrate. An implant-stop layer is used to cover the Si device regions during formation of the SiC crystalline regions.

An aspect of this description relates to a silicon substrate with a GaN-based device and a Si-based device on the silicon substrate is provided. The silicon substrate includes the GaN-based device on a SiC crystalline region. The SiC crystalline region is formed in the silicon substrate. The silicon substrate also includes the Si-based device on a silicon region, and the silicon region is next to the SiC crystalline region on the silicon substrate.

Another aspect of this description relates to a semiconductor device including a silicon substrate having a first region in the silicon substrate and a second region in the silicon substrate. The semiconductor device further includes a silicon carbide (SiC) crystalline layer in the first region and a gallium nitride (GaN) device formed on the SiC crystalline layer. The semiconductor device further includes a metal-oxide-semiconductor (MOS) device formed on the second region.

Still another aspect of this description relates to a semiconductor device including a silicon carbide (SiC) crystalline layer in a substrate. The semiconductor device further includes a first transistor on the SiC crystalline layer, the first transistor having a first terminal. The semiconductor device further includes a second transistor on the substrate, wherein the second transistor is spaced from the SiC crystalline layer, and the second transistor has a first terminal. The semiconductor device further includes an interconnect structure configured to electrically connect the first terminal of the first transistor to the first terminal of the second transistor.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A silicon substrate with a GaN-based device and a Si-based device on the silicon substrate, comprising:
   the GaN-based device on a SiC crystalline region, wherein the SiC crystalline region is over a portion of the silicon substrate, a bottom-most surface of the GaN-based device is above a top-most surface of the silicon substrate, and the SiC crystalline region is spaced from each isolation structure of a plurality of isolation structures in the silicon substrate; and
   the Si-based device in direct contact with a silicon region of the silicon substrate, wherein the silicon region directly contacts a portion of a sidewall of the SiC crystalline region adjacent a top surface of the silicon substrate, and the silicon region is adjacent to the SiC crystalline region on the silicon substrate.

2. The silicon substrate of claim 1, wherein a surface of the SiC crystalline region is at about the same level as a surface of the silicon region.

3. The silicon substrate of claim 1, wherein the GaN-based device is selected from the group consisting of light-emitting device, power switching device, regulator, battery protector, panel display driver, and telecommunication device.

4. The silicon substrate of claim 1, wherein the GaN-based device is a metal-oxide-semiconductor high-electron-mobility-transistor (MOS-HEMT) or an HEMT.

5. The silicon substrate of claim 1, wherein the Si-based device is a MOS field effect transistor (FET).

6. The silicon substrate of claim 1, wherein the silicon substrate directly contacts a bottom surface of the SiC crystalline region.

7. The silicon substrate of claim 1, further comprising a metal interconnect layer connecting the GaN-based device and the Si-based device.

8. A semiconductor device comprising:
a silicon substrate having a first region in the silicon substrate and a second region in the silicon substrate;
a plurality of isolation structures in the silicon substrate;
a silicon carbide (SiC) crystalline layer over the first region, wherein the SiC crystalline layer is formed by ion implantation in the silicon substrate, a sidewall of the silicon substrate directly contacts a portion of a sidewall of the SiC crystalline layer adjacent a top surface of the silicon substrate, the SiC crystalline region is spaced from each isolation structure of the plurality of isolation structures, and a top surface of the SiC crystalline layer is substantially co-planar with a top-most surface of the silicon substrate;
a gallium nitride (GaN) device formed on a top-most surface of the SiC crystalline layer; and
a metal-oxide-semiconductor (MOS) device formed on the second region.

9. The semiconductor device of claim 8, wherein the MOS device comprises a dielectric layer over the second region, and a thickness of the dielectric layer ranges from about 100 Å to about 5000 Å.

10. The semiconductor device of claim 8, wherein the GaN device comprises:
a GaN layer over the SiC crystalline layer;
an aluminum gallium nitride (AlGaN) layer over the GaN layer; and
a buffer layer between the GaN layer and the SiC crystalline layer.

11. The semiconductor device of claim 8, further comprising an interconnect structure over the GaN device and the MOS device, wherein the interconnect structure electrically connects the GaN device and the MOS device.

12. The semiconductor device of claim 8, further comprising an isolation structure between the GaN device and the MOS device.

13. The semiconductor device of claim 8, further comprising:
a first via connected to a terminal of the GaN device; and
a second via connected to a terminal of the MOS device, wherein the first via is in a metal layer farther from the silicon substrate than the second via.

14. A semiconductor device comprising:
a silicon carbide (SiC) crystalline layer in a substrate, wherein the substrate directly contacts a portion of a sidewall of the SiC crystalline region adjacent a top surface of the substrate and a bottom surface of the SiC crystalline layer;
a plurality of isolation structures in the substrate, wherein each isolation structure of the plurality of isolation structures is spaced from the SiC crystalline region;
a first transistor on a top-most surface of the SiC crystalline layer, the first transistor having a first terminal, wherein a first direction from the SiC crystalline layer to the first transistor is normal to a top surface of the substrate, and an interface between the first transistor and the SiC crystalline layer is above a top-most surface of the substrate;
a second transistor on a silicon region of the substrate, wherein the silicon region of the substrate is spaced from the SiC crystalline layer in a second direction perpendicular to the first direction, and the second transistor has a first terminal; and
an interconnect structure configured to electrically connect the first terminal of the first transistor to the first terminal of the second transistor.

15. The semiconductor device of claim 14, wherein the first transistor is a high electron mobility transistor (HEMT).

16. The semiconductor device of claim 14, wherein a distance from the first terminal of the first transistor to the substrate is greater than a distance from the first terminal of the second transistor to the substrate.

17. The semiconductor device of claim 14, wherein the first transistor comprises a group III-V compound material.

18. The semiconductor device of claim 14, wherein an isolation structure of the plurality of isolation structures is between the first transistor and the second transistor.

19. The semiconductor device of claim 14, further comprising a dielectric layer for isolating the interconnect structure.

20. The semiconductor device of claim 14, wherein the second transistor is a metal-oxide-semiconductor (MOS) transistor.

* * * * *